US006340818B1

United States Patent
Izumi et al.

(10) Patent No.: US 6,340,818 B1
(45) Date of Patent: Jan. 22, 2002

(54) TWO-DIMENSIONAL IMAGE DETECTOR

(75) Inventors: Yoshihiro Izumi, Kashihara; Osamu Teranuma, Tenri, both of (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/353,440

(22) Filed: Jul. 14, 1999

(30) Foreign Application Priority Data

Aug. 7, 1998 (JP) .............................. 10-223844

(51) Int. Cl.[7] .............................. G01J 1/24; G01B 9/04; H01L 29/08
(52) U.S. Cl. ............... 250/370.13; 250/370.09; 250/370.08; 250/208.1; 257/72
(58) Field of Search ............... 250/370.11, 370.13, 250/370.09, 370.18, 370.14, 370.16, 332, 338.4, 208.1; 257/72, 686, 735–738, 465, 466

(56) References Cited

U.S. PATENT DOCUMENTS

| | | | | |
|---|---|---|---|---|
| 5,391,881 A | * | 2/1995 | Jeuch et al. | 252/370.09 |
| 5,574,285 A | * | 11/1996 | Marion et al. | 250/370.13 |
| 5,723,866 A | * | 3/1998 | Hamilton, Jr. | 250/370.09 |
| 6,188,070 B1 | * | 2/2001 | Destefanis et al. | 250/370.08 |

FOREIGN PATENT DOCUMENTS

JP          6-342098 A       12/1994

OTHER PUBLICATIONS

Lee et al; "A New Digital Detector for Projection Radiography", SPIE, vol. 2432, 1995, pp. 237–249.
Jeromin et al, "Applicaton of a–Si Active–Matrix Technology in a X–Ray Detector Panel", SID 97 Digest, May 13–15, 1997, pp. 91–94.

* cited by examiner

Primary Examiner—Frank G. Font
Assistant Examiner—Zandra V. Smith
(74) Attorney, Agent, or Firm—Nixon & Vanderhye, P.C.

(57) ABSTRACT

A two-dimensional image detector comprises an active matrix substrate provided with a pixel layer which includes pixel electrodes arranged in matrix form and switching elements; a counter substrate, provided with an upper electrode provided over substantially the entirety of the pixel layer, and a semiconductor layer having photoconductivity, provided opposite the pixel layer; and a conductive adhesive material which connects the active matrix substrate and the counter substrate to each other; in which the active matrix substrate is provided with a second electrode section for inputting a signal to the upper electrode of the counter substrate, and the upper electrode and the second electrode section are electrically connected to each other via a conductive member.

12 Claims, 8 Drawing Sheets

TWO-DIMENSIONAL IMAGE DETECTOR

FIELD OF THE INVENTION

The present invention relates to a two-dimensional image detector capable of detecting images in radioactive rays (such as X-rays), visible light, infrared light, etc.

BACKGROUND OF THE INVENTION

Conventionally, a known type of two-dimensional image detector for radioactive rays is a device comprising a two-dimensional arrangement of semiconductor sensors which detect X-rays and produce charge (electron-hole) pairs, each sensor being provided with an electrical switch, in which the electrical switches are sequentially turned ON by row, and the charge of each sensor in that row is read out.

The principle of such a two-dimensional image detector and specific structures therefor are discussed in, for example, D. L. Lee, et al, "A New Digital Detector for Projection Radiography" (*Physics of Medical Imaging, Proc.* SPIE 2432, pp.237–249, 1995); L. S. Jeromin, et al, "Application of a-Si Active-Matrix Technology in a X-Ray Detector Panel" (SID (*Society for Information Display*) *International Symposium, Digest of Technical Papers*, pp.91–94, 1997); and Japanese Unexamined Patent Publication No. 6-342098/1994 (Tokukaihei 6-342098, published on Dec. 13, 1994).

The following will explain the principle and structure of the foregoing conventional two-dimensional image detector for radioactive rays. FIG. 7 is a perspective view schematically showing the structure of the foregoing conventional two-dimensional image detector for radioactive rays. Further, FIG. 8 is a cross-sectional view schematically showing the structure of one pixel thereof.

As shown in FIGS. 7 and 8, the foregoing conventional two-dimensional image detector for radioactive rays includes an active matrix substrate made up of electrode lines (gate electrodes 52 and source electrodes 53) arranged in an XY matrix, TFTs (thin-film transistors) 54, charge storage capacitors (Cs) 55, etc., provided on a glass substrate 51. Further, over substantially the entire surface of the active matrix substrate 51 are provided a photoconductive film 56, a dielectric layer 57, and an upper electrode 58.

Each charge storage capacitor 55 is made up of a Cs electrode 59 and a pixel electrode 60 (which is connected to the drain electrode of the TFT 54), provided opposite each other but separated by an insulating layer 61.

The photoconductive film 56 is made of a semiconductor material which produces a charge when radioactive rays such as X-rays are projected thereon; the examples discussed in the foregoing documents use amorphous selenium (a-Se), which has high dark resistance and good photoconductive characteristics for X-rays. The photoconductive film 56 (a-Se) is formed by vacuum vapor deposition with a thickness of 300 $\mu$m to 600 $\mu$m.

For the foregoing active matrix substrate, it is possible to use active matrix substrates formed in the process of manufacturing liquid crystal display devices. For example, an active matrix substrate used in an active matrix liquid crystal display device (AMLCD) has a structure which includes TFTs made of amorphous silicon (a-Si) or polycrystalline silicon (p-Si), electrodes arranged in an XY matrix, and charge storage capacitors (Cs). Accordingly, it is easy to use such an AMLCD as an active matrix substrate for a two-dimensional image detector for radioactive rays, necessitating only minor design changes.

The following will explain the operating principle of the foregoing conventional two-dimensional image detector for radioactive rays.

When radioactive rays are projected onto the photoconductive film 56 of, e.g., a-Se, charge (electron-hole) pairs are produced therein. As shown in FIGS. 7 and 8, the photoconductive film 56 and the charge storage capacitor 55 are electrically connected in series, and thus if a voltage is applied between the upper electrode 58 and the Cs electrode 59 in advance, the electron and hole members of the charge pairs produced in the photoconductive film 56 move to the + and − electrode sides, respectively. As a result, a charge accumulates in the charge storage capacitor 55. Between the photoconductive film 56 and the charge storage capacitor 55 is provided a carrier blocking layer 62 made of a thin insulating layer, which serves as a blocking photodiode for blocking a charge injection from one side to the other.

By putting the TFTs 54 in an open state by means of input signals from gate electrodes $G_1, G_2, G_3, \ldots, G_n$, the charges accumulated in the respective charge storage capacitors 55 due to the foregoing effect can be drawn out through source electrodes $S_1, S_2, S_3, \ldots, S_n$. Since the electrode lines (the gate electrodes 52 and the source electrodes 53), the TFTs 54, the charge storage capacitors 55, etc. are all provided in the form of an XY matrix, X-ray image information can be obtained two-dimensionally by sequential scanning of the signals inputted to the gate electrodes $G_1, G_2, G_3, \ldots, G_n$.

Incidentally, if the photoconductive film 56 used has photoconductivity not only for radioactive rays such as X-rays but also for visible light, infrared light, etc., the foregoing conventional two-dimensional image detector can also function as a two-dimensional image detector for visible light, infrared light, etc.

The foregoing conventional two-dimensional image detector for radioactive rays uses a-Se for the photoconductive film 56, but a-Se has the following drawbacks. First, since the transmission characteristics of photoelectric current by a-Se are of the dispersion type peculiar to amorphous materials, response is poor. Further, due to the insufficient sensitivity to X-rays (S/N ratio) of a-Se, information cannot be read out unless the charge storage capacitors 55 are sufficiently charged by long X-ray exposure.

Further, in the foregoing conventional two-dimensional image detector for radioactive rays, a dielectric layer 57 is provided between the photoconductive film 56 (a-Se) and the upper electrode 58 in order to prevent accumulation of a charge in the charge storage capacitors due to current leakage during X-ray projection, to reduce current leakage (dark current), and to protect from high voltage. However, since it is necessary to add a step (sequence) for eliminating a residual charge from the dielectric layer 58 after each frame, another drawback of the foregoing conventional two-dimensional image detector for radioactive rays is that it can only be used for pickup of still images.

In order to obtain image data corresponding to moving images, on the other hand, it is necessary to use, instead of a-Se, a photoconductive film 56 which is made of a crystalline (or polycrystalline) material, and which also has superior sensitivity to X-rays (S/N ratio). By improving the sensitivity of the photoconductive film 56, it is possible to charge the charge storing capacitor 55 with X-ray exposure of short duration, and since a high voltage need not be applied to the photoconductive film 56, the dielectric layer 57 itself is no longer necessary.

Known examples of this kind of photoconductive material with superior sensitivity to X-rays include CdTe and CdZnTe. Since photoelectric absorption of X-rays by a substance is generally proportional to the fifth power of its effective atomic number, if, for example, the effective atomic number of Se is 34 and that of CdTe is 50, then CdTe can be expected to have a sensitivity of approximately 6.9 times that of Se. However, if replacement of the a-Se in the foregoing conventional two-dimensional image detector with CdTe or CdZnTe is attempted, the following problems arise.

With conventional a-Se, a film can be formed by vacuum vapor deposition, and in this case, since the film formation temperature can be set at room temperature, it is easy to form a film on the foregoing active matrix substrate. With CdTe or CdZnTe, on the other hand, film formation by MBE (molecular beam epitaxy) or MOCVD (metal organic chemical vapor deposition) are known; in view of film formation on, in particular, substrates of large surface area, MOCVD is considered most suitable.

However, when forming a film of CdTe or CdZnTe by MOCVD, since the starting materials organic cadmium and organic tellurium have heat decomposition temperatures of approximately 300° C. (for dimethyl cadmium—DMCd) and approximately 400° C. (for diethyl tellurium—DETe) or approximately 350° C. (for diisopropyl tellurium—DiPTe), a high film formation temperature of around 400° C. is needed.

The TFTs 54 formed on the foregoing active matrix substrate generally use semiconductor layers made of films of a-Si or p-Si, which, in order to improve semiconductor characteristics, are formed while adding hydrogen ($H_2$) at a film formation temperature of 300° C. to 350° C. The heat resistance of a TFT element formed in this manner is approximately 300° C., and exposure to higher temperatures causes the hydrogen to escape from the a-Si or p-Si film, thus impairing semiconductor characteristics.

Accordingly, in consideration of film formation temperature, it is in fact difficult to use MOCVD to form a film of CdTe or CdZnTe on the foregoing active matrix substrate.

SUMMARY OF THE INVENTION

It is an object of the present invention to provide a two-dimensional image detector which has good response, and which is capable of dealing with moving images.

In order to attain the foregoing object, a two-dimensional image detector according to the present invention comprises:
  an active matrix substrate, provided with a pixel layer which includes pixel electrodes and switching elements arranged in matrix form;
  a counter substrate which includes a first electrode section provided over substantially the entirety of the pixel layer, and a semiconductor layer having photoconductivity, provided opposite the pixel layer; and
  conductive connection means which mutually connect the active matrix substrate and the counter substrate;
  in which the active matrix substrate is provided with a second electrode section for inputting a signal to the first electrode section of the counter substrate; and
  the first and second electrode sections are electrically connected to each other via electrode transition means.

With the foregoing structure, the first electrode section and the semiconductor layer are provided on the counter substrate, which is separate from the active matrix substrate, and the active matrix substrate and the counter substrate are electrically connected to each other by the conductive connection means.

Accordingly, a photoconductive film of a crystalline (or polycrystalline) material such as CdTe or CdZnTe, which have better sensitivity to X-rays (S/N) than a-Se, can be used as the semiconductor layer, without impairing the semiconductor characteristics of the switching elements formed on the active matrix substrate. As a result, it becomes possible to pick up moving images in real time.

Further, with the foregoing structure, the active matrix substrate is provided with a second electrode section for inputting a signal to the first electrode section provided on the counter substrate, and the first and second electrode sections are electrically connected to each other via electrode transition means. In other words, by inputting an electrical signal to the second electrode section, the electrical signal can be inputted into the first electrode section via the electrode transition means.

Incidentally, in typical two-dimensional image detectors, the periphery of the active matrix substrate is provided with bus line signal input terminals. Since an external driving LSI (large scale integrated circuit), data readout LSI, etc. must be connected to these terminals, the active matrix substrate is generally larger in size than the counter substrate. Accordingly, with the foregoing structure, the second electrode section provided on the active matrix substrate can be easily connected to external signal input means. Consequently, an electrical signal can be easily inputted to the first electrode section via the electrode transition means.

Additional objects, features, and strengths of the present invention will be made clear by the description below. Further, the advantages of the present invention will be evident from the following explanation in reference to the drawings.

DESCRIPTION OF THE EMBODIMENTS

The following will explain one embodiment of the present invention with reference to FIGS. 1 through 6.

Figure 1:
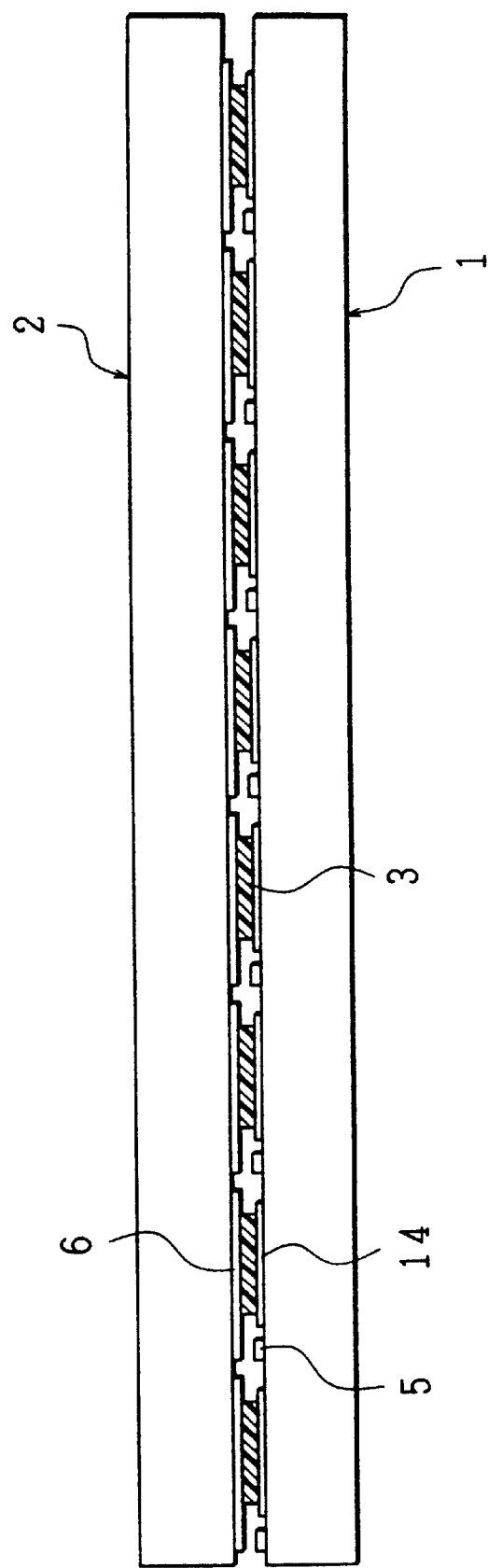
FIG. 1 is a cross-sectional view schematically showing the overall structure of a two-dimensional image detector according to one embodiment of the present invention.
Figure 2:
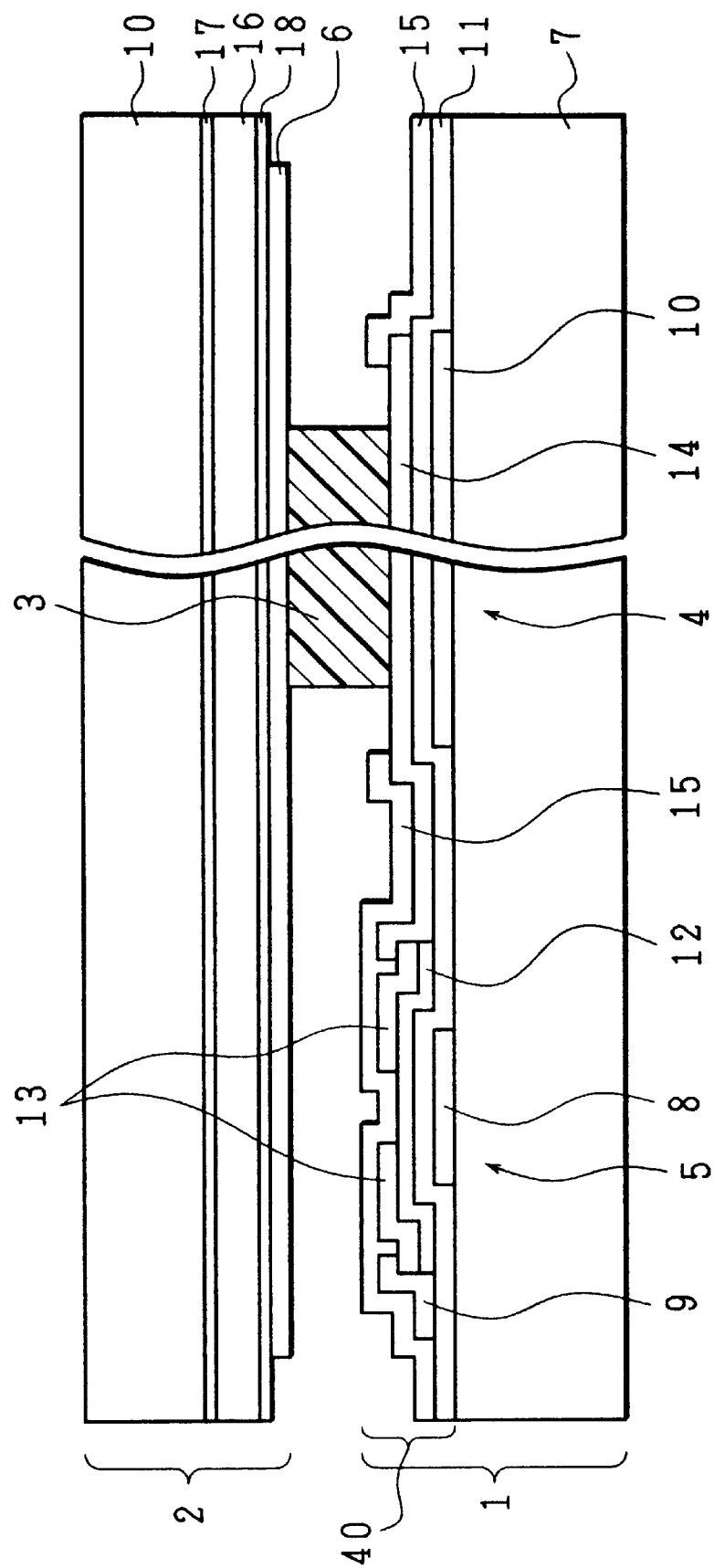
FIG. 2 is a cross-sectional view schematically showing the structure of one pixel of the foregoing two-dimensional image detector.

FIG. 1 is a cross-sectional view showing the basic structure of the entirety of a two-dimensional image detector according to the present embodiment, and FIG. 2 is a cross-sectional view showing in detail the basic structure of one pixel of the two-dimensional image detector according to the present embodiment.

As shown in FIG. 1, the two-dimensional image detector according to the present embodiment is made up of an active matrix substrate 1 provided with TFTs (thin-film transistors) 5 as switching elements and pixel electrodes 14, and a counter substrate 2 provided with connected electrodes 6; the two substrates being laminated together by conductive connecting members 3, which have adhesion.

The following will explain the detailed structure of one pixel of the present two-dimensional image detector with reference to FIG. 2.

The active matrix substrate 1 is made up of electrode lines (gate electrodes 8 and source electrodes 9), charge storage capacitors 4, TFTs 5, etc., arranged in an XY matrix on a glass substrate 7. In other words, the electrodes 8 and 9 (electrode lines), the charge storage capacitors 4, and the TFTs 5 make up a pixel layer 40 of the active matrix substrate 1.

The glass substrate 7 is made of a non-alkaline glass substrate (such as #7059 and #1737 available from Corning Industries, Inc.), and is provided with the gate electrode 8, made of a metal film of Ta, etc. The gate electrode 8 is obtained by sputtering deposition of a film of Ta, etc. approximately 3000 Å in thickness, followed by patterning in a desired shape. At this time, the charge storage capacitor 4 (Cs electrode) is also provided. Next, an insulating film 11 approximately 3500 Å in thickness is provided by CVD (chemical vapor deposition) of $SiN_x$, $SiO_x$, etc. The insulating film 11 functions as a gate insulating film for the TFT 5, and as a dielectric layer between the electrodes of the charge storage capacitor 4. Incidentally, for the insulating film 11, an anodic oxidation film provided by anodizing the gate electrode 8 and the charge storage capacitor 4 may be used along with the $SiN_x$, $SiO_x$, etc.

Next, an a-Si film 12 (i layer), which forms a channel section of the TFT 5, and an a-Si film 13 (n+layer), which provides contact between the source and drain electrodes, are provided with thicknesses of 1000 Å and 400 Å, respectively, by CVD followed by patterning in a desired shape. Next, a source electrode 9 and a drain electrode (also serving as the pixel electrode 14), which are metal films of Ta, Al, etc., are provided. The source electrode 9 and the drain electrode are obtained by sputtering deposition of the metal film, followed by patterning in a desired shape. Incidentally, the pixel electrode 14 and the drain electrode may be provided separately, and it is also possible to use a transparent electrode of ITO, etc. for the pixel electrode 14.

Then, in order to insulate and protect all areas other than the opening of the pixel electrode 14, an insulating protective film 15 is provided. The insulating protective film 15 is obtained by forming an insulating film of $SiN_x$, $SiO_x$, etc. approximately 6000 Å in thickness by CVD, followed by patterning in a desired shape. Instead of an inorganic insulating film, the insulating protective film 15 may be an organic film of acrylic, polyimide, etc. In this way, the active matrix substrate 1 is completed.

Incidentally, in the present embodiment, the TFT elements of the active matrix substrate 1 are a-Si TFTs 5 having an inverse-staggered structure, but there is no limitation to this; it is also possible to use p-Si, and to use a staggered structure. Further, the active matrix substrate 1 may be prepared by the same process as that used for active matrix substrates prepared in the process of manufacturing liquid crystal display devices.

The counter substrate 2, on the other hand, includes a supporting substrate 10 made of a material having transitivity for X-rays, visible light, etc., such as glass, ceramics, silicon, etc. Incidentally, the supporting substrate 10 in the present embodiment is a substrate of glass, which has superior transitivity for both X-rays and visible light, with a thickness of 0.7 mm to 1.1 mm. This type of substrate transmits almost all X-rays of 10 keV to 100 keV.

First, an upper electrode 17 (first electrode section) made of a metal such as Ti or Au is provided over substantially the entirety of one surface of the supporting substrate 10. However, when used in a two-dimensional image detector which detects images in visible light, or when it is necessary to inspect the semiconductor layer 16 formed in a later manufacturing step by viewing through the supporting substrate 10, it is necessary to use as the upper electrode 17 an ITO electrode, which has transitivity for visible light.

Next, a semiconductor layer 16, made of CdTe, CdZnTe, etc. having a thickness of approximately 0.5 mm, is provided on the upper electrode 17 by MOCVD. MOCVD is suited to film formation on a substrate of large surface area, and is capable of forming, at a temperature of 40° C. to 500° C., a polycrystalline film of the materials organic cadmium (dimethyl cadmium (DMCd)), organic tellurium (such as diethyl tellurium (DETe) and diisopropyl tellurium (DiPTe)), and organic zinc (such as diethyl zinc (DEZn), diisopropyl zinc (DiPZn), and dimethyl zinc (DMZn)). Incidentally, instead of MOCVD, a film of CdTe, CdZnTe, etc. may be formed by another method, such as screen printing and baking, proximity sublimation, electro-deposition, spraying, etc.

Then a charge blocking layer 18, made of a thin insulating layer of $AlO_x$, is provided over substantially the entire surface of the semiconductor layer 16. Thereafter, a connecting electrode 6 is provided by forming a conductive film of Cr, Au, ITO, etc. approximately 2000 Å thick, followed by patterning in a desired shape. The connected electrode 6 is provided in a location corresponding to that of the pixel electrode 14 provided in the active matrix substrate 1.

In this way, by providing a connected electrode 6 independently in each pixel, the semiconductor layer 16 of the counter substrate 2 is electrically divided into pixels. Accordingly, the charge produced in the semiconductor layer 16 by incident radioactive rays or light rays collects only in connected electrodes 6 corresponding to the incident position, and since the charge does not spread to surrounding pixels, electrical crosstalk is suppressed.

Next, on one of the two substrates (the active matrix substrate 1 and the counter substrate 2) prepared by means of the foregoing process, the conductive connecting members 3 are provided in locations corresponding to the pixel electrodes 14, by pattern coating using screen printing, or by patterning by photolithography. Then, by combining together and pressure bonding the two substrates so that the pixel electrodes 14 align with the connecting electrodes 6, the two substrates are electrically and physically connected, yielding a panel. In this way, the two-dimensional image detector according to the present invention is completed.

Here, if the conductive connecting members 3 are to be pattern coated by screen printing, a conductive connecting material may be used which contains carbon having optimum viscosity and thixotropy for screen printing. Again, if the conductive connecting members 3 are to be patterned by photolithography, a conductive connecting material which may be used is, for example, a photosensitive resin containing carbon.

Incidentally, in addition to the foregoing materials, it is also possible to use an anisotropic conductive connecting material (such as an adhesive with conductive particles dispersed therein), which, even without patterning, only conducts in a vertical direction. By use of such an anisotropic conductive connecting material, crosstalk between adjacent pixels can be eliminated and conduction and connection by pixel can be realized, even without patterning, by merely coating or transferring the connecting material over substantially the entire surface.

Figure 3:
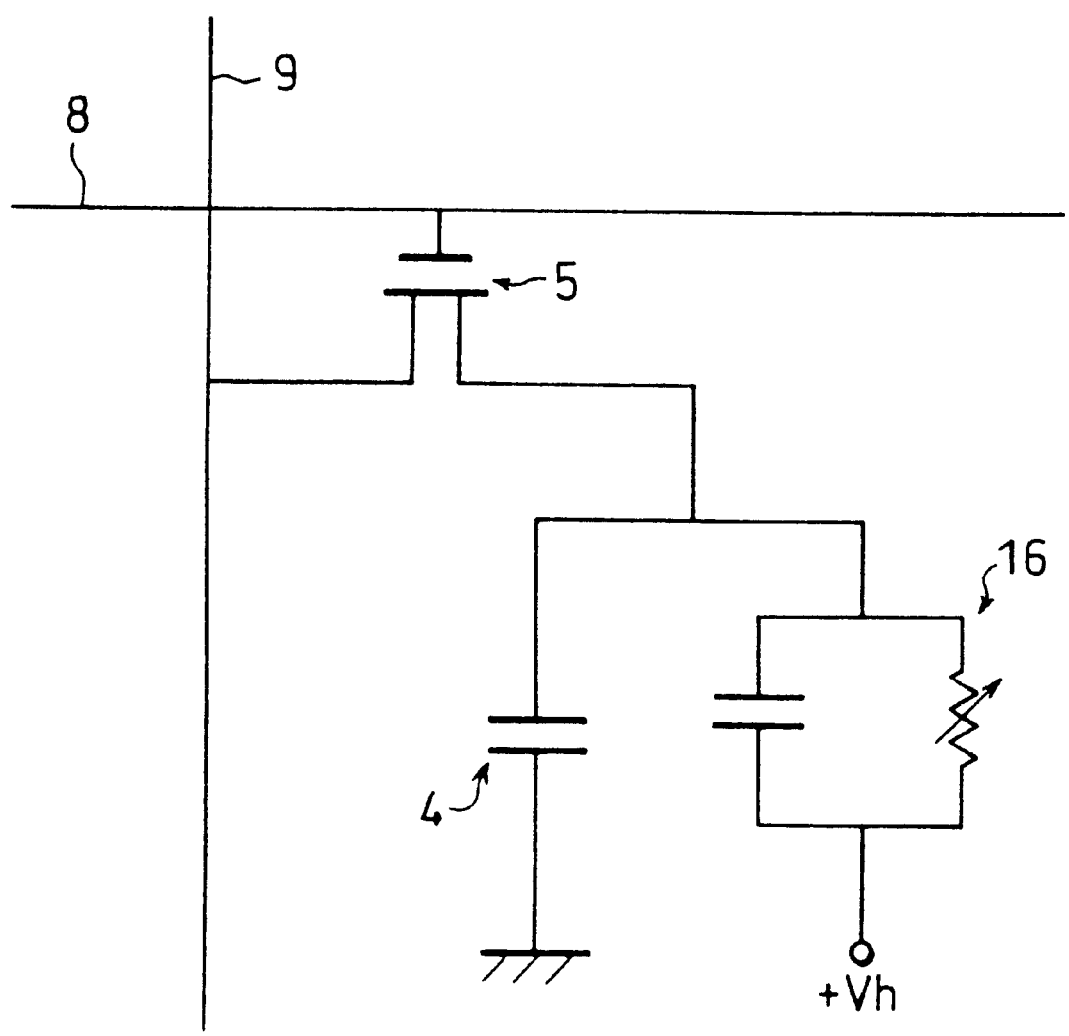
FIG. 3 is a circuit diagram showing an equivalent circuit corresponding to one pixel of the foregoing two-dimensional image detector.

FIG. 3 shows an equivalent circuit diagram of one pixel of the two-dimensional image detector according to the present embodiment. Next, the operating principle of the two-dimensional image detector according to the present embodiment will be explained with reference to FIGS. 2 and 3. When X-rays are incident on the semiconductor layer 16 (photoconductive film) made of CdTe, CdZnTe, etc., charge (electron-hole) pairs are produced in the semiconductor layer 16 due to a photoconductive effect. Here, the charge storage capacitor 4 and the semiconductor layer 16 are serially connected via the pixel electrode 14, the conductive connecting member 3, and the connected electrode 6, and thus if a voltage is applied between the upper electrode 17 and the charge storage capacitor 4 in advance, the electron and hole members of the charge pairs produced in the semiconductor layer 16 move to the + and − electrode sides, respectively. As a result, a charge accumulates in the charge storage capacitor 4.

As noted above, the charge blocking layer 18, which is thin insulating layer, is provided between the semiconductor layer 16 and the charge storage capacitor 4, and serves as a blocking photodiode having an MIS (metal-insulator-semiconductor) structure, for blocking a charge injection from one side to the other. This structure contributes to reduction of dark current when X-rays are not incident on the semiconductor layer 16. In other words, when a positive voltage is applied from the upper electrode 17 side, the charge blocking layer 18 acts to block injection of electrons from the connected electrode 6 to the semiconductor layer 16. Further, by also providing an insulating layer between the semiconductor layer 16 and the upper electrode 17, it is possible to block injection of holes from the upper electrode 17 to the semiconductor layer 16, thus contributing to further reduction of dark current.

Instead of the foregoing MIS structure, the blocking photodiode may of course use a PIN junction structure or Schottky junction structure. In this case, voltage may be applied to the upper electrode 17 with a polarity which puts the blocking photodiode in an inverse-bias state.

By putting the TFT 5 in an open state by means of input signals from the gate electrode 8, the charge accumulated in the charge storage capacitor 4 due to the foregoing effect can be drawn out through the source electrode 9. Since, as also shown in the conventional example shown in FIG. 7, the electrode lines (the gate electrodes 8 and the source electrodes 9), the TFTs 5, the charge storage capacitors 4, etc. are all provided in the form of an XY matrix, X-ray image information can be obtained two-dimensionally by sequential scanning of the signals inputted to the gate electrodes $G_1, G_2, G_3, \ldots, G_n$. In this way, the basic operating principle is much the same as that of the conventional two-dimensional image detector for radioactive rays.

However, in the two-dimensional image detector according to the present embodiment, structured as above, it is possible to use a photoconductive film made of CdTe, CdZnTe, etc., and thus it is possible to pick up moving images in real time.

Figure 7:
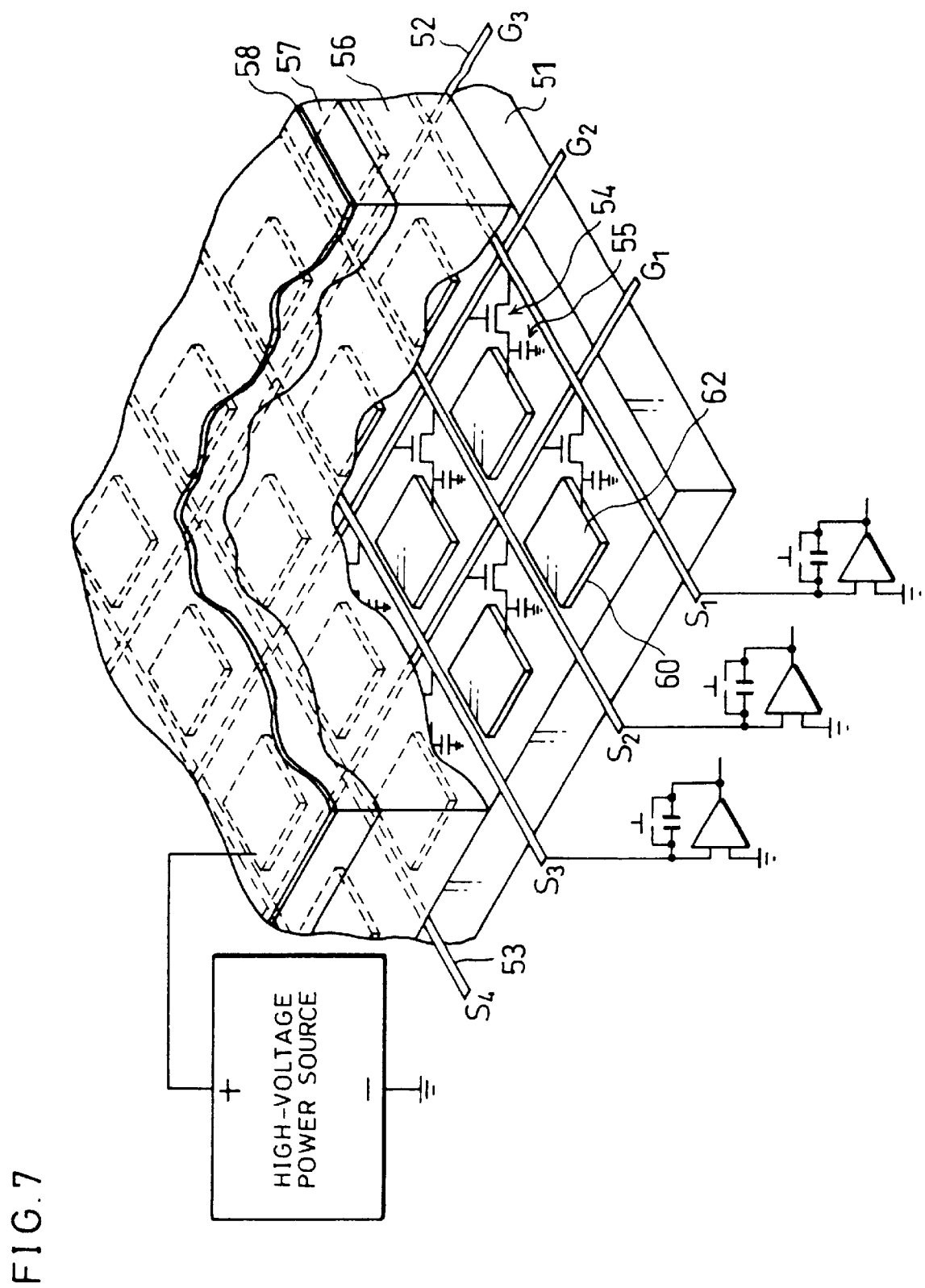
FIG. 7 is a perspective view showing the structure of a conventional two-dimensional image detector.
Figure 8:
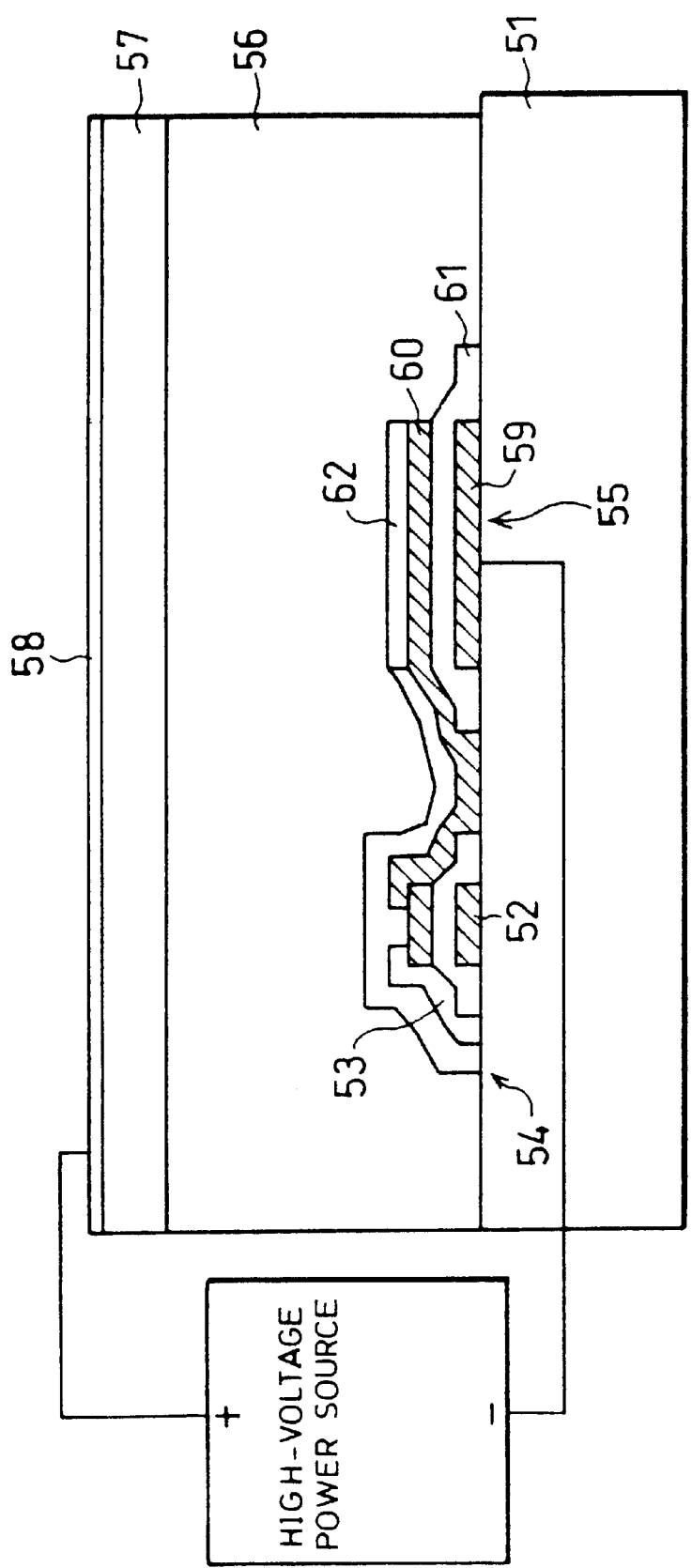
FIG. 8 is a cross-sectional view showing the structure of one pixel of a conventional two-dimensional image detector.

Here, it is generally necessary to apply a predetermined voltage to the upper electrode 17 of the two-dimensional image detector in order to move the electrons and holes produced in the semiconductor layer 16 by absorption of X-rays. For example, the conventional two-dimensional image detector shown in FIGS. 7 and 8 is structured so that the semiconductor layer and the upper electrode are directly laminated, in this order, on the active matrix substrate. Accordingly, since the upper electrode is the uppermost layer, it is easy to apply an external voltage to the upper electrode. However, the two-dimensional image detector according to the present embodiment of the present invention, described above, is structured so that the upper electrode and the semiconductor layer are laminated, in this order, on the supporting substrate, which is part of the counter substrate and thus separate from the active matrix substrate, after which the counter substrate and the active matrix substrate are combined. Accordingly, the upper electrode is not exposed on the uppermost surface.

The following will explain a structure, characteristic to the present embodiment, for easy input of an electrical signal to the upper electrode.

Figure 4:
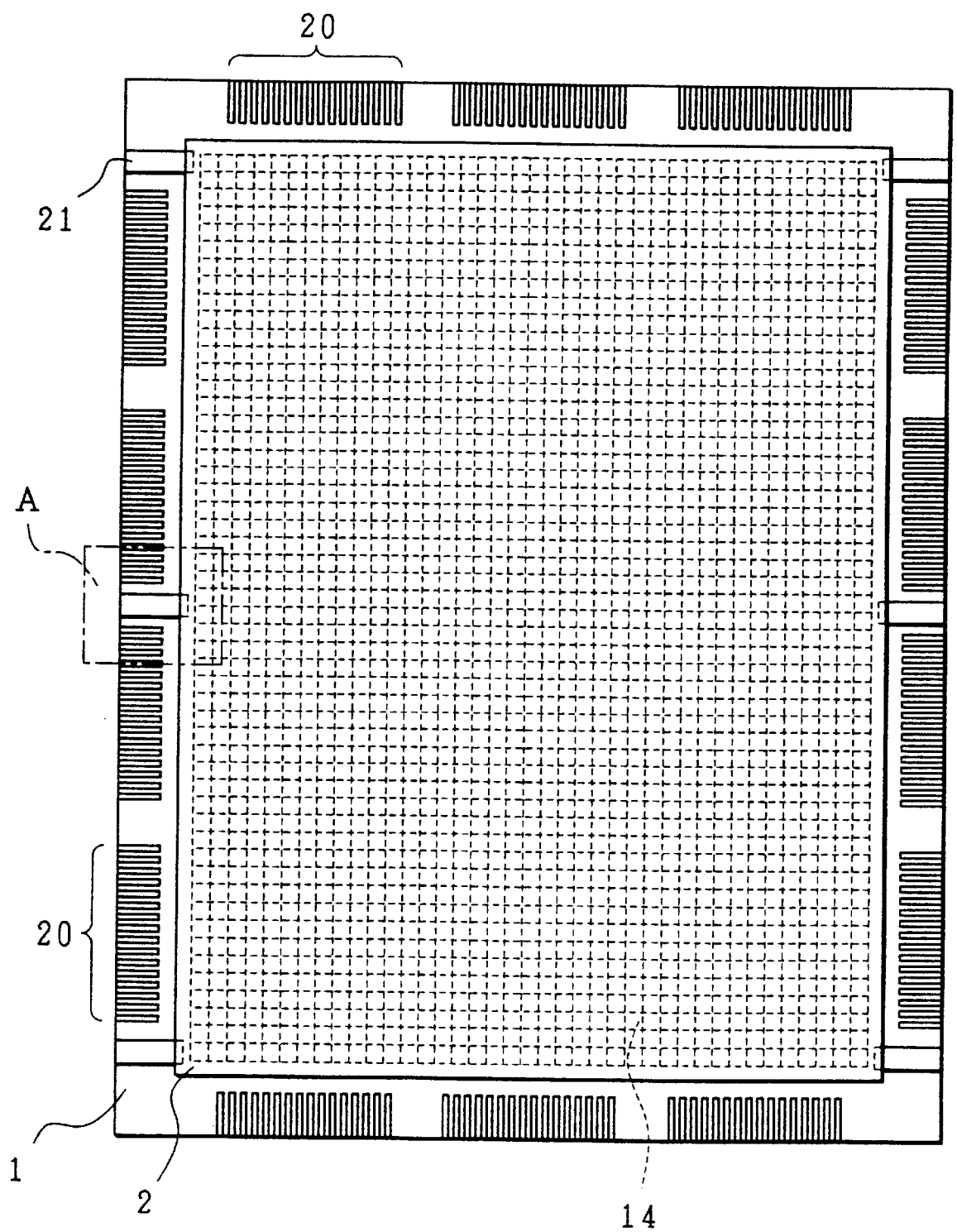
FIG. 4 is an explanatory drawing showing one example of a process for combining an active matrix substrate and a counter substrate of the foregoing two-dimensional image detector.
Figure 5A:
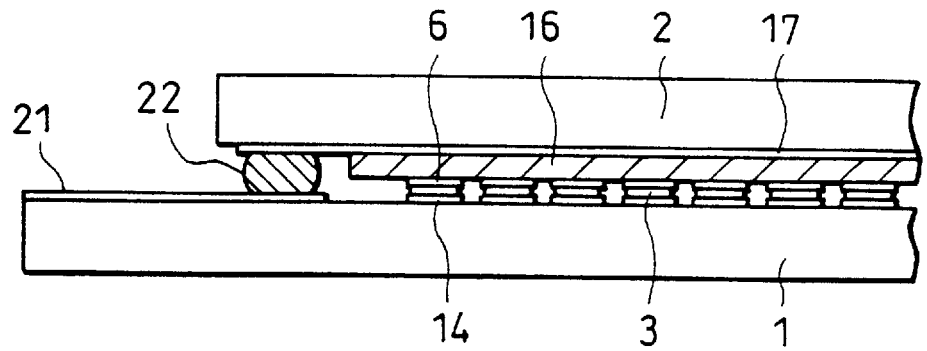
FIG. 5(a) is an enlarged cross-sectional view schematically showing one example of a structure of area A of the two-dimensional image detector shown in FIG. 4.
Figure 5B:
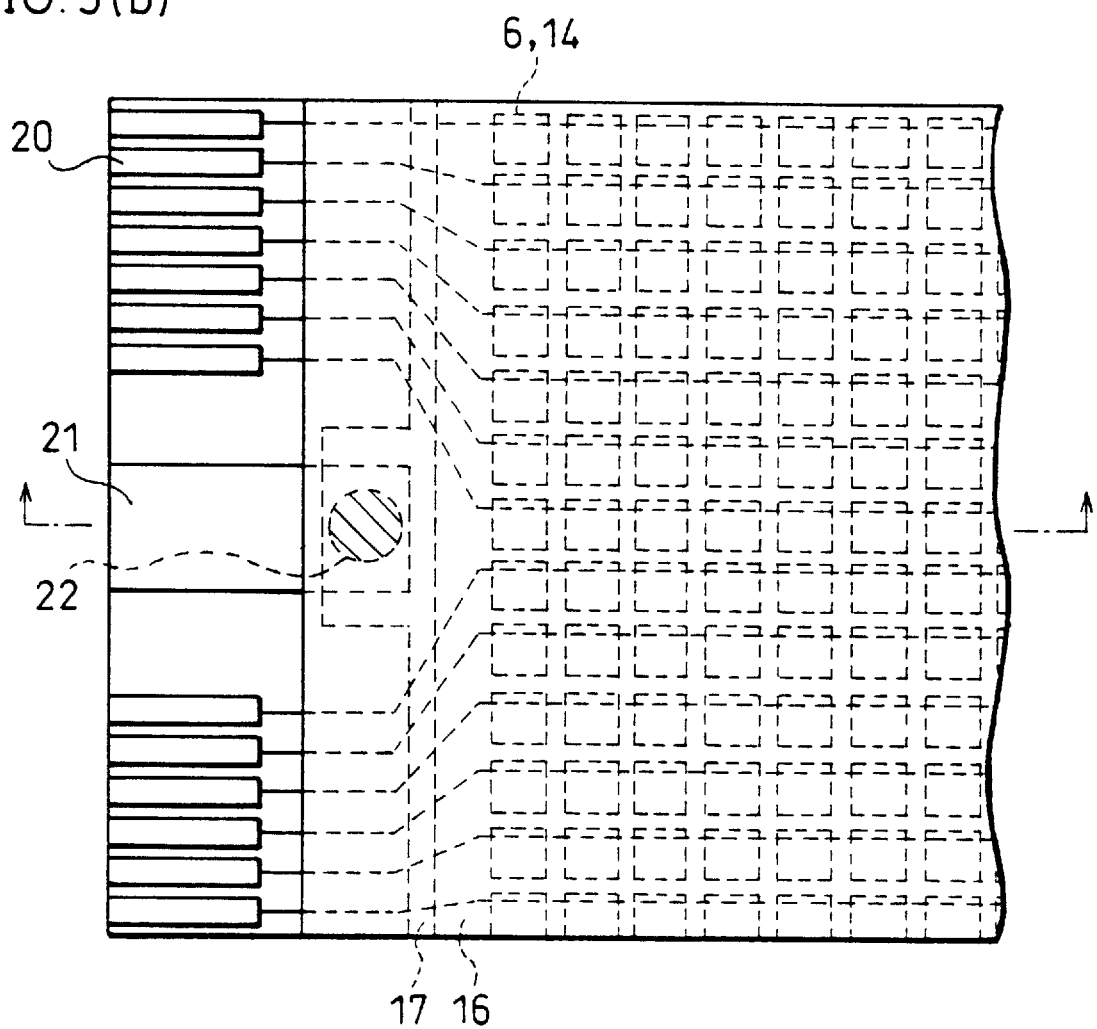
FIG. 5(b) is an enlarged plan view schematically showing one example of a structure of area A of the two-dimensional image detector shown in FIG. 4.

FIG. 4 is a plan view schematically showing the overall structure of a two-dimensional image detector according to the present embodiment. Further, FIGS. 5(a) and 5(b) are an enlarged cross-sectional view and an enlarged plan view, respectively, showing the structure of area A of the two-dimensional image detector shown in FIG. 4. Here, in order to clarify the structure shown in the drawings, structures such as the electron blocking layer, switching elements, charge storage capacitors, etc. have been omitted.

In regard to the relative sizes of the active matrix substrate 1 and the counter substrate 2 making up the two-dimensional image detector according to the present embodiment, the active matrix substrate 1 is somewhat larger than the counter substrate 2, as shown in FIG. 4. This is because the periphery of the active matrix substrate 1 is provided with signal input terminals 20 for the electrode lines (bus lines) arranged in matrix form, and because the signal input terminals 20 must be connected to an external driving LSI (large scale integrated circuit), data readout LSI, etc.

In the two-dimensional image detector according to the present embodiment, as shown in FIGS. 4 and 5(b), a second electrode 21 (input terminal) is provided between adjacent groups of signal input terminals 20 for the electrode lines (bus lines) arranged in matrix form. Incidentally, in order to facilitate connection to external LSIs, the signal input terminals 20 are provided in groups according to the LSI they are to be connected to, thus creating spaces between adjacent groups of signal input terminals 20. The second electrode 21 is situated in such a space.

The second electrode 21 is provided to perform signal input to the upper electrode 17 on the counter substrate 2 side. In area A, where the upper electrode 17 overlaps with the second electrode 21, a conductive member 22 (electrode transition means) is provided. The second electrode 21 is made of a conductive film of Ta, Mo, ITO, etc., and preferably is formed at the same time as the electrode lines (bus lines) 8 and 9 and the pixel electrodes 14 provided on the active matrix substrate 1.

With the foregoing structure, by inputting an electrical signal to the second electrode 21 provided on the active matrix substrate 1, the electrical signal can be inputted to the upper electrode 17 via the conductive member 22. Accordingly, the second electrode 21 provided on the active matrix substrate 1 can be easily connected to external signal input means. Specifically, connection to external signal lines is possible by soldering, wire bonding, conductive connecting members, anisotropic conductive adhesive, etc.

The conductive member 22 serves as means for electrically connecting the upper electrode 17 and the second electrode 21. Specifically, the conductive member 22 is made of an adhesive paste containing a conductive material such as carbon or Ag, and is provided in an area A in the drawings, where the upper electrode 17 overlaps with the second electrode 21. A dispenser device may be used to dot a suitable quantity of this adhesive paste onto the second electrode 21 on the active matrix substrate 1 prior to combination with and connection to the counter substrate 2. In the present embodiment, the amount of conductive adhesive paste used for the conductive member 22 was adjusted so as to form a pattern of approximately $\phi$ 1 mm after combination of the substrates.

Figure 6A:
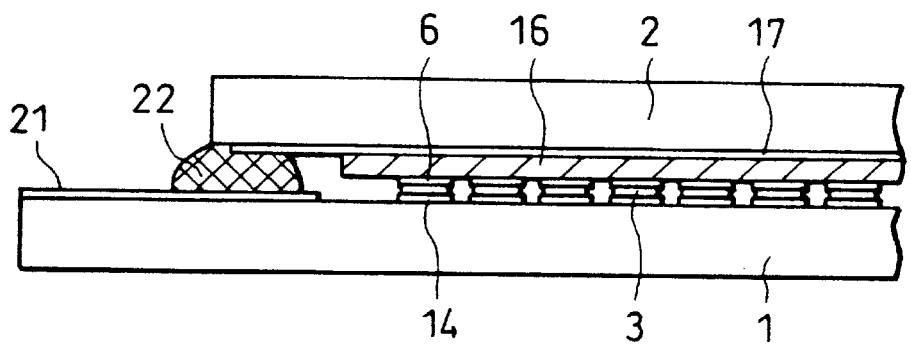
FIG. 6(a) is an enlarged cross-sectional view schematically showing another example of a structure of area A of the two-dimensional image detector shown in FIG. 4.
Figure 6B:
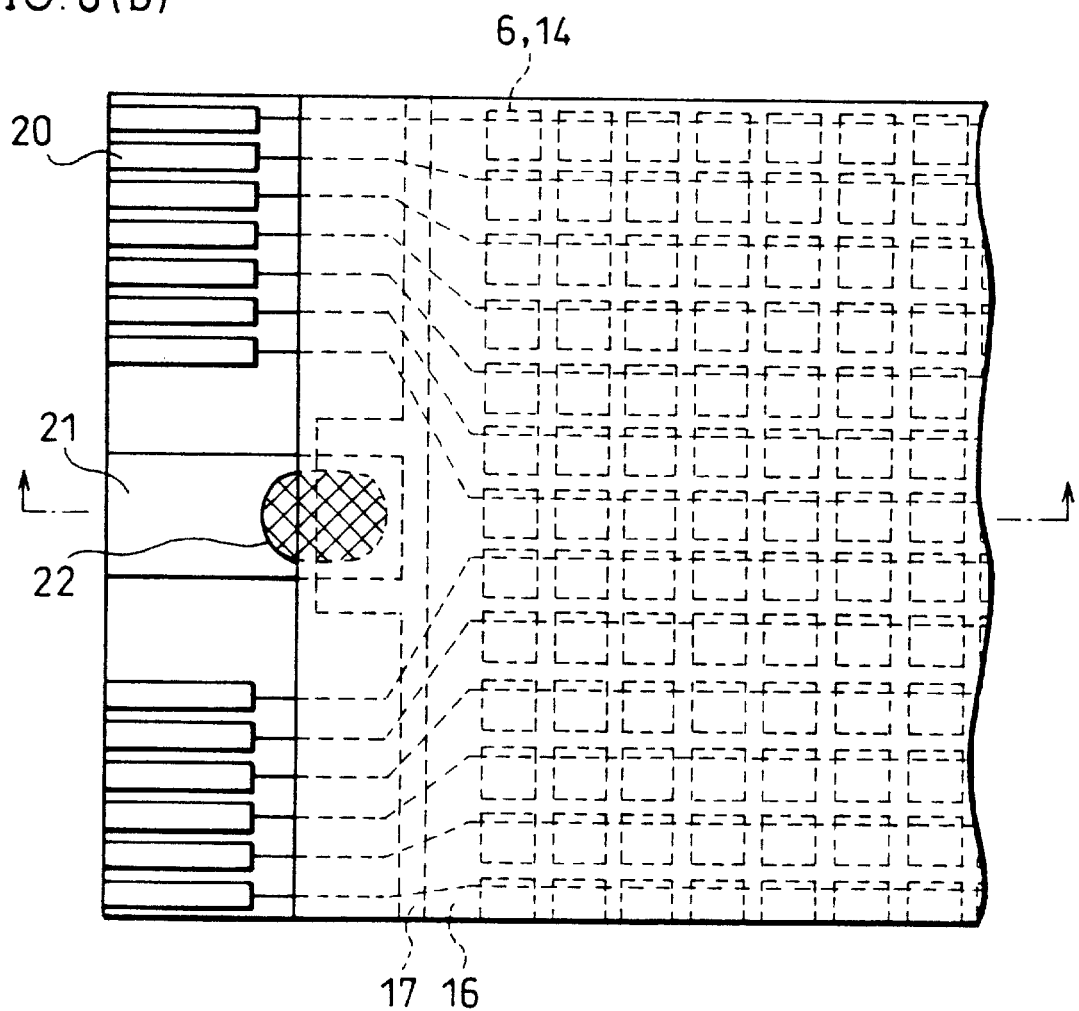
FIG. 6(b) is an enlarged plan view schematically showing another example of a structure of area A of the two-dimensional image detector shown in FIG. 4.

The method of forming the conductive member 22 according to the present embodiment is not limited to the foregoing method; another possible method is, after processing for combining the substrates, to drop a small amount of the conductive adhesive paste from the edge of the counter substrate 2. With this method, by providing a suitable amount of the conductive adhesive paste, adjusted to a suitable viscosity, in an area where the second electrode 21 overlaps with the upper electrode 17 at the edge of the counter substrate 2, the conductive adhesive paste can be allowed to seep, of its own accord, 1 mm to 2 mm in from the edge of the counter substrate 2. Accordingly, the conductive member 22 formed by this method, as shown in FIGS. 6(a) and 6(b), can also provide electrical connection between the upper electrode 17 and the second electrode 21.

Further, it is preferable to use for the conductive member 22 a material which is sufficiently hardened under the process conditions (processing temperature) required for combination of the active matrix substrate 1 and the counter substrate 2. By using such a material, it is unnecessary to add a further process for hardening the conductive member 22, and the conventional substrate combination process can be used to form the conductive member 22 at the same time. Specifically, the present embodiment used an epoxy-type adhesive paste containing carbon, which is hardened by heat processing at above approximately 120° C. It is also possible to use a conductive adhesive paste containing conductive particles of Au, Ni, Ag, etc., or to pressure weld a small lump of a soft metal such as In directly to the second electrode 21.

The heating conditions required to pressure bond the active matrix substrate 1 and the counter substrate 2 vary depending on the material used for the conductive connecting members 3, and use of epoxy-type conductive connecting members 3 requires heating at around 150° C. Consequently, it is possible to also harden the conductive member 22 used for the electrode transition means under the baking conditions (approximately 150° C.) at the time of combining the substrates.

In the two-dimensional image detector according to the present embodiment, the upper electrode 17 (first electrode section) is, in the image pickup area, covered by the semiconductor layer 16, but is exposed in an area where the conductive member 22 is provided, as shown in FIGS. 5(a), 5(b), 6(a), and 6(b). Consequently, the conductive member 22 used as the electrode transition means can be easily connected to the upper electrode 17.

Such a structure may be accomplished by, for example, first providing both the upper electrode 17 and the semiconductor layer 16, and then using sandblasting, etching, etc. to remove the semiconductor layer 16 in the area where the conductive member 22 is to be provided; or by first masking the area of the upper electrode 17 where the conductive member 22 is to be provided, and then selectively providing the semiconductor layer 16 in the areas other than the masked area. In the present embodiment, the latter method was used. Specifically, the semiconductor layer 16 was formed by patterning, by first providing a metal mask of stainless steel in the area where the conductive member 22 was later to be provided, and then providing the semiconductor layer 16 on the upper electrode 17, after which the metal mask was removed.

It is preferable to provide a conductive member 22 at a plurality of places in a single two-dimensional image detector. In the present embodiment, a conductive member 22 is provided in each of six places, three on the left side and three on the right side of the plan view shown in FIG. 4. A conductive member 22 as described above may be provided in one place alone, but by providing conductive members 22 at a plurality of places, as in the present embodiment, an electrical signal can be inputted to the upper electrode 17 even if several of the plurality of conductive members 22 have connection malfunctions, by input through the remainder of the conductive members 22.

Further, even if the present embodiment is applied to a large-sized panel of around 45 cm×35 cm, since the signal is inputted to the upper electrode 17 from a plurality of places around its periphery, the influence of signal delay, voltage drop, etc. due to the electrical resistance of the upper electrode 17 can be minimized, and uniform voltage application conditions can be maintained within the upper electrode 17. In consideration of these points, it is also possible, although not shown in the drawings, to provide a plurality of conductive members 22 on each of the four (upper, lower, left, right) sides of the two-dimensional image detector.

Incidentally, the foregoing embodiment of the present invention explained a two-dimensional image detector chiefly suited to X-rays (radioactive rays), but if the semiconductor (photoconductor) used has photoconductivity not only for radioactive rays such as X-rays but also for visible light, infrared light, etc., it is necessary to use a transparent electrode which transmits visible light, infrared light, etc. Further, in this case, it is also necessary to optimize the thickness of the semiconductor (photoconductor) according to its efficiency in absorbing visible light or infrared light.

Further, the present invention is not limited to the semiconductor layer and sensor structure discussed above, and may be applied to two-dimensional image detectors which use other photoconductive materials and other sensor structures. For example, it is possible to use another semiconductive material, such as a-Se or a-Si, as the photoconductor film. Further, the counter substrate side may be structured of a combination of a conversion layer which converts X-rays into visible light (for example, CsI) and a visible light sensor.

As discussed above, a first two-dimensional image detector according to the present invention comprises:
  a pixel layer which includes electrode lines arranged in matrix form, switching elements provided at the respective intersections of the matrix, and charge storage capacitances including pixel electrodes connected to the electrode lines via the switching elements;

a first electrode section provided over substantially the entirety of the pixel layer; and a semiconductor layer having photoconductivity, provided between the pixel layer and the first electrode section;

the two-dimensional image detector being provided with an active matrix substrate which includes the pixel layer and a counter substrate which includes the first electrode section and the semiconductor layer; and the two substrates being positioned such that the pixel layer of the active matrix substrate is opposite the semiconductor layer of the counter substrate, and being connected to each other by a conductive adhesive material;

in which the active matrix substrate is provided with a second electrode section for inputting a signal to the first electrode section of the counter substrate, and the first and second electrode sections are electrically connected to each other via electrode transition means.

With the foregoing structure, the active matrix substrate is provided with a second electrode section for inputting a signal to the first electrode section provided on the counter substrate, and the first and second electrode sections are electrically connected to each other by the electrode transition means. In other words, by inputting an electrical signal to the second electrode section, the electrical signal can be inputted into the first electrode section via the electrode transition means.

Incidentally, in typical two-dimensional image detectors, the periphery of the active matrix substrate is provided with bus line signal input terminals. Since an external driving LSI, data readout LSI, etc. must be connected to these terminals, the active matrix substrate is generally larger in size than the counter substrate. Accordingly, with the foregoing structure, the second electrode section provided on the active matrix substrate can be easily connected to external signal input means. Consequently, an electrical signal can be easily inputted to the first electrode section via the electrode transition means.

Further, a second two-dimensional image detector according to the present invention is structured as the first two-dimensional image detector above, in which the electrode transition means are provided in a plurality of places.

With the foregoing structure, an electrical signal can be inputted to the first electrode section even if several of the plurality of electrode transition means have connection malfunctions, by input through the remainder of the electrode transition means. Further, even if the two-dimensional image detector has a large surface area, since the signal is inputted to the first electrode section from a plurality of places around its periphery, the influence of signal delay, voltage drop, etc. due to the electrical resistance of the first electrode section can be minimized, and uniform voltage application conditions can be maintained within the first electrode section.

A third two-dimensional image detector according to the present invention is structured as the first or second two-dimensional image detector above, in which, of the first electrode section included in the counter substrate, an area thereof where the electrode transition means are provided is exposed from the semiconductor layer.

With the foregoing structure, electrical connection can be performed, allowing an electrical signal to be easily inputted to the first electrode section from the second electrode section via the electrode transition means.

Further, a fourth two-dimensional image detector according to the present invention is structured as the any one of the first through third two-dimensional image detectors above, in which the electrode transition means are made of a conductive material which hardens at a processing temperature required for combination and connection of the two substrates.

With the foregoing structure, it is unnecessary to add a further process for hardening the conductive material used as the electrode transition means, and the conventional substrate combination process can be used to form the electrode transition means at the same time.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations, provided such variations do not depart from the spirit of the present invention or exceed the scope of the patent claims set forth below.

What is claimed is:

1. A two-dimensional image detector comprising:

an active matrix substrate, provided with a pixel layer which includes pixel electrodes and switching elements arranged in matrix form;

a counter substrate which includes a first electrode section provided over substantially the entirety of said pixel layer, and a semiconductor layer having photoconductivity, provided opposite said pixel layer; and conductive connection means which mutually connect said active matrix substrate and said counter substrate;

in which said active matrix substrate is provided with a second electrode section for inputting a signal to said first electrode section of said counter substrate; and said first and second electrode sections are electrically connected to each other via electrode transition means.

2. The two-dimensional image detector set forth in claim 1, wherein:

said pixel layer comprises electrode lines arranged in the form of a matrix; a plurality of switching elements, each provided at an intersection of the matrix; and charge storage capacitances which include pixel electrodes connected to said electrode lines via said switching elements.

3. The two-dimensional image detector set forth in claim 1, wherein:

said conductive connection means comprise:

connected electrodes patterned on said counter substrate in positions opposite said pixel electrodes; and conductive connecting members having conductivity and adhesion, which connect said connected electrodes and said pixel electrodes.

4. The two-dimensional image detector set forth in claim 1, wherein:

a plurality of said electrode transition means are provided.

5. The two-dimensional image detector set forth in claim 1, wherein:

of said first electrode section included in said counter substrate, an area of said first electrode section where said electrode transition means are provided is exposed from said semiconductor layer.

6. The two-dimensional image detector set forth in claim 1, wherein:

said electrode transition means are made of a conductive material which hardens at a processing temperature required for combination and connection of said active matrix substrate and said counter substrate.

7. The two-dimensional image detector set forth in claim 1, wherein:

said counter substrate includes a charge blocking layer provided on said semiconductor layer, said charge blocking layer blocking injection of a charge from one side thereof.

8. The two-dimensional image detector set forth in claim 1, wherein:

said first electrode section is an ITO electrode.

9. The two-dimensional image detector set forth in claim 1, wherein:

said semiconductor layer has sensitivity to radiation.

10. The two-dimensional image detector set forth in claim 9, wherein:

said semiconductor layer is a semiconductor made of a CdTe compound or of a CdZnTe compound.

11. The two-dimensional image detector set forth in claim 2, wherein:

a periphery of said active matrix substrate is provided with groups of signal input/output terminals for said electrode lines; and said second electrode section is provided in a space between adjacent groups of said signal input/output terminals.

12. The two-dimensional image detector set forth in claim 1, wherein:

said electrode transition means are made of an adhesive paste containing a conductive substance.

* * * * *